United States Patent
Chlipala et al.

(10) Patent No.: US 8,680,907 B2
(45) Date of Patent: Mar. 25, 2014

(54) DELAY CIRCUIT HAVING REDUCED DUTY CYCLE DISTORTION

(75) Inventors: James D. Chlipala, Emmaus, PA (US); Scott A. Segan, Allentown, PA (US)

(73) Assignee: Agere Systems LLC, Allentown, PA (US)

( * ) Notice: Subject to any disclaimer, the term of this patent is extended or adjusted under 35 U.S.C. 154(b) by 845 days.

(21) Appl. No.: 12/033,567

(22) Filed: Feb. 19, 2008

(65) Prior Publication Data
US 2009/0108902 A1 Apr. 30, 2009

Related U.S. Application Data

(60) Provisional application No. 60/984,170, filed on Oct. 31, 2007.

(51) Int. Cl.
*H03H 11/26* (2006.01)
(52) U.S. Cl.
USPC .............................. 327/261; 327/269; 327/285
(58) Field of Classification Search
USPC ......... 327/261, 263, 364, 266, 269, 272, 274, 327/276, 278, 280, 285, 287, 264
See application file for complete search history.

(56) References Cited

U.S. PATENT DOCUMENTS

| | | | | |
|---|---|---|---|---|
| 6,661,265 B2* | 12/2003 | Partsch et al. | ................. | 327/276 |
| 6,870,415 B2* | 3/2005 | Zhang et al. | .................. | 327/274 |
| 6,879,200 B2* | 4/2005 | Komura et al. | ............... | 327/278 |
| 2007/0030753 A1* | 2/2007 | Kwak | ............................ | 365/233 |
| 2008/0005632 A1* | 1/2008 | Inoue | ............................. | 714/724 |
| 2008/0122513 A1* | 5/2008 | Ong et al. | ..................... | 327/263 |
| 2008/0265967 A1* | 10/2008 | Goller | ............................ | 327/295 |
| 2009/0091360 A1* | 4/2009 | Heinimaki | .................... | 327/116 |

OTHER PUBLICATIONS

N. Tiwari et al., "Skew Generation and Analysis in Timing-Critical Circuits," EDN, Nov. 13, 2003, pp. 87-96.

* cited by examiner

*Primary Examiner* — Long Nguyen
(74) *Attorney, Agent, or Firm* — Ryan, Mason & Lewis, LLP

(57) ABSTRACT

A delay circuit having reduced duty cycle distortion is provided. The delay circuit includes a plurality of delay elements connected together in a series configuration. Each of the delay elements has a prescribed delay associated therewith. The delay circuit further includes a controller connected to respective outputs of the delay elements. The controller is configured such that signal paths between the respective outputs of the delay elements and an output of the controller have delays that are substantially the same relative to one another. Each of the signal paths has a tri-statable switching element associated therewith.

23 Claims, 3 Drawing Sheets

DLE = DELAY LINE ELEMENT

DELAY CIRCUIT HAVING REDUCED DUTY CYCLE DISTORTION

CROSS-REFERENCE TO RELATED APPLICATION(S)

This application claims the benefit of U.S. Provisional Application Ser. No. 60/984,170, filed on Oct. 31, 2007, the disclosure of which is incorporated by reference herein.

FIELD OF THE INVENTION

The present invention relates generally to the electrical and electronic arts, and more particularly relates to delay circuitry.

BACKGROUND OF THE INVENTION

The use of programmable delay lines in integrated circuits for signal de-skewing is well-known. For example, FIG. 1 illustrates a conventional approach to reducing signal skew by forming a differential delay line which incorporates a differential delay element 100 having reduced duty cycle distortion. As apparent from the figure, this approach employs two inverter chains, a first inverter chain including a first inverter 102, and a second inverter chain including a second inverter 104. An input signal, IP, to the first inverter 102 may be a complementary clock signal while a second input signal, IN, to the second inverter 104 may be a normal (e.g., true) clock signal. The differential delay element 100 further includes a pair of cross-coupled inverters, 106 and 108, connected between the first and second inverter chains. An output of inverter 108 is connected to an output of the first inverter 102, and input of inverter 108 is connected to an output of the second inverter 104, an output of inverter 106 is connected to the output of the second inverter 104, and an input of inverter 106 is connected to the output of the first inverter 102.

The cross-coupled inverters 106 and 108, which are low-strength (weak) inverters, ensure that the rise and fall times of the two inverter chains are balanced. This tends to equalize the propagation delay for rising and falling edges. A more detailed description of this approach can be found in an article by N. Tiwari and R. Saraswat, entitled "Skew generation and analysis in timing-critical circuits," *EDN*, pp. 87-96, Nov. 13, 2003, the disclosure of which is incorporated by reference herein. Duty cycle distortion due to different propagation delay times for rising and falling edges can introduce duty cycle distortion in variable delay lines. This duty cycle distortion can be a function of the selected delay value. This is true even when the delay line is constructed from inherently duty cycle distortion resistant delay elements such as described in conjunction with FIG. 1.

Accordingly, there exists a need for techniques for reducing duty cycle distortion in a delay circuit which do not suffer from one or more of the above-described problems associated with conventional delay circuitry.

SUMMARY OF THE INVENTION

Illustrative embodiments of the present invention meet the above-noted need by providing techniques for beneficially reducing duty cycle distortion in a delay circuit without significantly impacting performance and/or area. To accomplish this, embodiments of the invention eliminate multiplexers and associated multiplexer decoding circuitry often used to select a desired delay signal path in a delay circuit. Instead, each of the delay signal paths in the delay circuit are configured to be substantially identical to one another by advantageously utilizing tri-statable switching elements for selecting a desired delay signal path in the delay circuit.

In accordance with one aspect of the invention, a delay circuit having reduced duty cycle distortion is provided. The delay circuit includes a plurality of delay elements connected together in a series configuration. Each of the delay elements has a prescribed delay associated therewith. The delay circuit further includes a controller connected to respective outputs of the delay elements. The controller is configured such that signal paths between the respective outputs of the delay elements and an output of the controller have delays that are substantially the same relative to one another. Each of the signal paths has a tri-statable switching element associated therewith. One or more delay circuits may be implemented in an integrated circuit device.

These and other features, aspects and advantages of the present invention will become apparent from the following detailed description of illustrative embodiments thereof, which is to be read in connection with the accompanying drawings.

DETAILED DESCRIPTION OF THE INVENTION

The present invention will be described herein in the context of exemplary delay line circuits. It is to be understood, however, that the techniques of the present invention are not limited to the circuits shown and described herein. Rather, embodiments of the invention are directed to techniques for reducing duty cycle distortion in a delay line, without significantly impacting performance and/or area of the circuit. Although preferred embodiments of the invention may be fabricated in a silicon wafer, embodiments of the invention can alternatively be fabricated in wafers comprising other materials, including but not limited to Gallium Arsenide (GaAs), Indium Phosphide (InP), etc.

Figure 1:
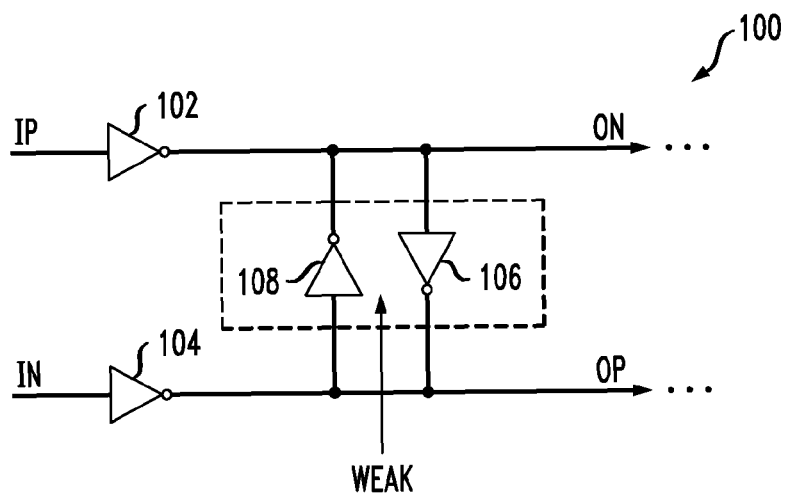
FIG. 1 is a schematic diagram depicting at least a portion of an illustrative differential delay element that may be used in forming a delay circuit.
Figure 2:
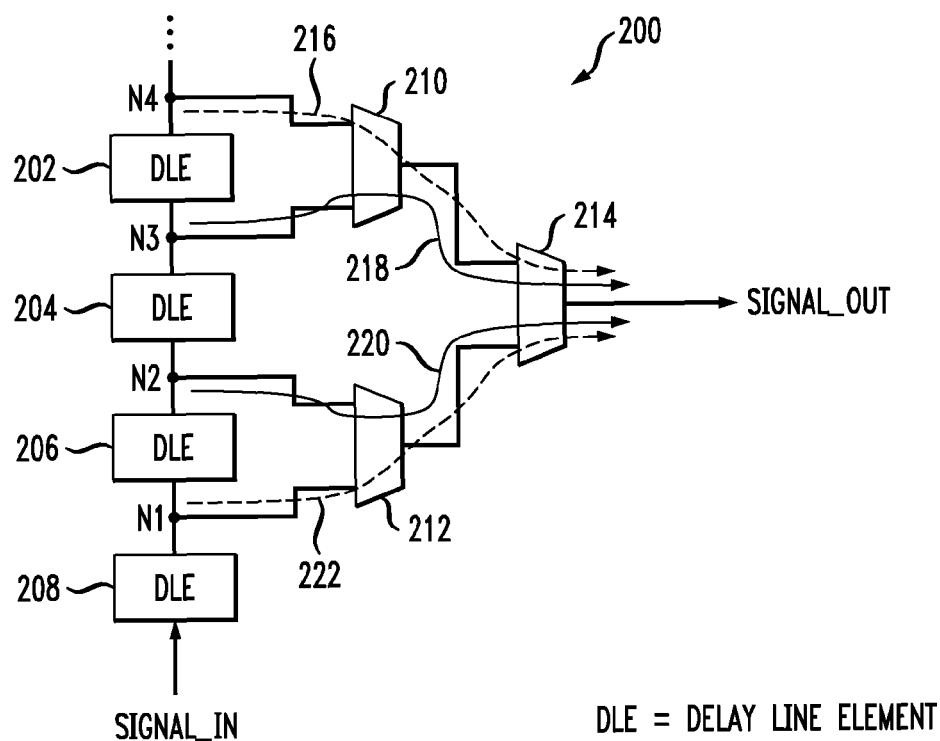
FIG. 2 is a block diagram depicting at least a portion of an exemplary delay circuit which utilizes multiplexers for selecting a desired one of a plurality of delay signal paths.

As previously stated, the illustrative differential delay element 100 shown in FIG. 1, which may be referred to herein as a delay line element (DLE), represents one approach to forming a delay line having reduced signal skew. Unfortunately, one disadvantage with this DLE is that, due to its differential architecture, a delay line employing a plurality of DLEs configured in such a manner would undesirably suffer a substantial area penalty. But regardless of the type of DLEs (e.g., differential or single-ended) employed in the delay line, one or more multiplexers are generally required to select, as an output signal, a given one of the outputs of the DLEs, as shown in FIG. 2. The use of multiplexers in the delay line, however, has its own associated disadvantages.

By way of illustration only, FIG. 2 is a block diagram depicting an exemplary delay circuit 200 including a plurality of DLEs, 202, 204, 206 and 208, connected together in a series chain, and a plurality of two-input multiplexers, 210, 212 and 214, coupled, either directly or indirectly, to respective outputs of the DLEs for selecting which one of the outputs of the DLEs to use as an output signal, Signal_Out, of the delay circuit. More particularly, an input signal, Signal_In, is presented to an input of a first DLE 208, an output of the first DLE is connected to an input of a second DLE 206 at node N1, an output of the second DLE is connected to an input of a third DLE 204 at node N2, an output of the third DLE is connected to an input of a fourth DLE 202 at node N3, and an output of the fourth DLE may be connected to an input of a subsequent DLE in the chain (not shown) at node N4. Outputs of the first and second DLEs 208, 206 are connected to first and second inputs, respectively, of a first multiplexer 212 and outputs of the third and fourth DLEs 204, 202 are connected to first and second inputs, respectively, of a second multiplexer 210. Outputs of the first and second multiplexers 212, 210 are connected to first and second inputs, respectively, of a third multiplexer 214. An output of the third multiplexer 214 generates the output signal Signal_Out of the delay circuit 200.

Each multiplexer 210, 212 and 214 includes a select input (not shown for clarity) for receiving a corresponding control signal and is operative to select, as a function of the corresponding control signal, which one of the inputs to connect to the output. One of four possible delay line taps, corresponding to nodes N1, N2, N3 and N4, is preferably selected to appear at the output of multiplexer 214 by programming the appropriate select inputs for the multiplexers, as will become apparent to those skilled in the art.

One disadvantage with using multiplexers in a delay circuit is that duty cycle distortion through the multiplexers is path dependent. Specifically, the propagation delay for rising and/or falling signal edges is different depending on which multiplexer input is selected. Therefore, since differences in rising and falling edge propagation delays are a primary cause of duty cycle distortion, each of the four different output signal paths, namely, signal paths 216, 218, 220 and 222, will exhibit a different duty cycle distortion relative to one another. Even given a zero duty cycle distortion delay line, corresponding multiplexer circuitry (e.g., decoding circuitry) necessary to select a desired delay may also introduce programmed delay-dependent duty cycle distortion, which is undesirable.

Figure 3:
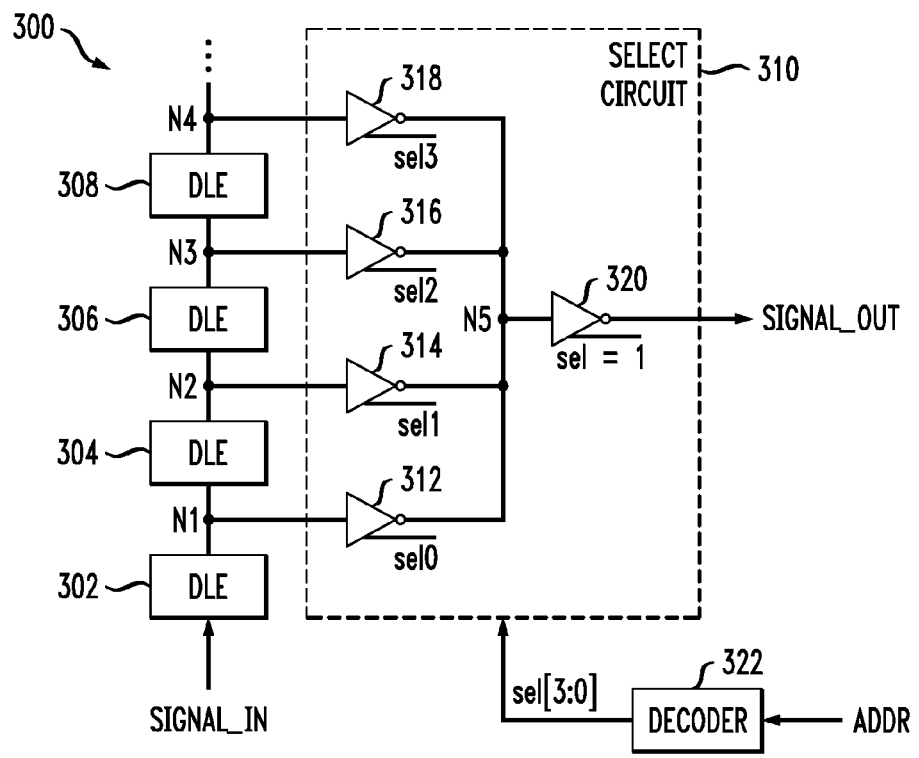
FIG. 3 is a schematic diagram depicting at least a portion of an exemplary delay circuit, formed in accordance with an embodiment of the invention.

FIG. 3 is a schematic diagram depicting at least a portion of an exemplary delay circuit 300, formed in accordance with an embodiment of the invention. Delay circuit 300 advantageously eliminates duty cycle distortion attributable to the use of multiplexers and associated decoding circuitry by replacing the multiplexers with a plurality of tri-state inverter stages. More particularly, delay circuit 300 includes a plurality of DLEs, 302, 304, 306 and 308, connected together in a series configuration, which may be referred to herein as a delay chain, and a delay tap selection circuit 310, or alternative controller, coupled to the DLEs for selecting a desired delay. Each of the DLEs has a prescribed delay associated therewith. Although the DLEs preferably have the same delay value, DLEs having different delays relative to one another are similarly contemplated by the invention.

Selection circuit 310 is configured such that signal paths between respective outputs of the plurality of DLEs 302, 304, 306 and 308 and an output (Signal_Out) of the delay circuit 300 have delays associated therewith that are substantially the same (e.g., matched) relative to one another. This advantageously provides a switching mechanism having a delay that is substantially independent of the signal path through the selection circuit 310. In order to accomplish this, selection circuit 310 preferably includes a plurality of tri-statable inverters, or alternative tri-statable switching elements (e.g., pass gate, etc.) for selecting one of a plurality of corresponding delay line taps as an output signal, Signal_Out, generated at an output of the delay circuit 300. A first tri-statable inverter 312 includes an input connected to an output of a first DLE 302 at node N1, a second tri-statable inverter 314 includes an input connected to an output of a second DLE 304 at node N2, a third tri-statable inverter 316 includes an input connected to an output of a third DLE 306 at node N3, and a fourth tri-statable inverter 318 includes an input connected to an output of a fourth DLE 308 at node N4. Node N1 forms a first delay tap, node N2 forms a second delay tap, node N3 forms a third delay tap, and node N4 forms a fourth delay tap. Outputs of the respective tri-statable inverters 312, 314, 316, 318 are connected together at node N5. The number of tri-statable inverters in selection circuit 310 will preferably be a function of the number of delay taps in the delay chain. In the illustrative delay circuit 300 shown, four delay taps are provided, at nodes N1 through N4, and therefore four tri-statable inverters 312, 314, 316 and 318 are included. It is to be understood, however, that although four tri-statable inverters 312, 314, 316 and 318 are shown, the invention is not limited to any specific number of tri-statable inverters employed.

Selection circuit 310 preferably includes a fifth tri-statable inverter 320, or an alternative buffer circuit, having an input coupled to the outputs of the tri-statable inverters 312, 314, 316, 318 at node N5 and an output for generating the output signal Signal_Out. Tri-statable inverter 320 may be inverting (as shown) or non-inverting. Tri-statable inverter 320 is preferably operative to buffer tri-statable inverters 312, 314, 316, 318 from the output of the delay circuit 300.

Each of tri-statable inverters 312, 314, 316 and 318 in the selection circuit 310 includes an enable input for receiving a corresponding select signal, sel0, sel1, sel2 and sel3, respectively, presented thereto. Collectively, the select signals may be referred to as sel[3:0]. Delay circuit 300 may include a decoder 322, or alternative decoding circuitry, for generating the select signals sel[3:0] as a function of one or more control signals, which may be an address signal, Addr, applied to the delay circuit 300. The tri-statable inverters are preferably operative as standard inverters when their respective enable inputs are activated, such as, for example, by application of a logic high level signal thereto (e.g., positive voltage supply, Vdd). When their enable inputs are deactivated, such as, for example, by application of a logic low level signal thereto (e.g., zero volts), the respective outputs of the tri-statable inverters are preferably in a high impedance state (e.g., undriven).

Preferably only one of tri-statable inverters 312, 314, 316 and 318 is active at any given time. When only one of the four enable inputs to tri-statable inverters 312, 314, 316 and 318 is selected and the other three are deselected, the corresponding one of the tri-statable inverters will drive the input to tri-statable inverter 320 while the other three tri-statable inverters remain in the passive, non-driving (high impedance) state. A select signal, sel, applied to the select input of tri-statable inverter 320 is preferably active (e.g., logic high "1") at least whenever any of tri-statable inverters 312, 314, 316, 318 is active. To accomplish this, the select input to ti-statable inverter 320 may be connected to Vdd, or an alternative logic high voltage source. Alternatively, the select signal sel applied to tri-statable inverter 320 may be derived from the select signals sel[3:0], for example, a logical OR of the select signals. In this manner, whenever one of the select signals sel[3:0] is a logic high level, signal sel is a logic high level. By way of example only, if a three-DLE delay is desired, select signals sel[3:0] can be set to 0100, where "0" is indicative of a logic low level and "1" is indicative of a logic high level, to thereby activate tri-statable inverter 316 for selecting the delay tap at node N3.

Preferably, each of the tri-statable inverters 312, 314, 316, 318 will be substantially identical to one another. As such, each of the respective delay signal paths will be substantially identical. Thus, using the inventive approach described herein, every delay line tap will experience qualitatively the same output circuitry with the same duty cycle distortion. Furthermore, any duty cycle distortion introduced by the tri-statable inverter can be canceled by driving one inverting cell with an identical inverting cell, as will become apparent to those skilled in the art given the teachings herein. Of course, in illustrative delay circuit 300, the inverting cells are tri-statable inverters.

Figure 4:
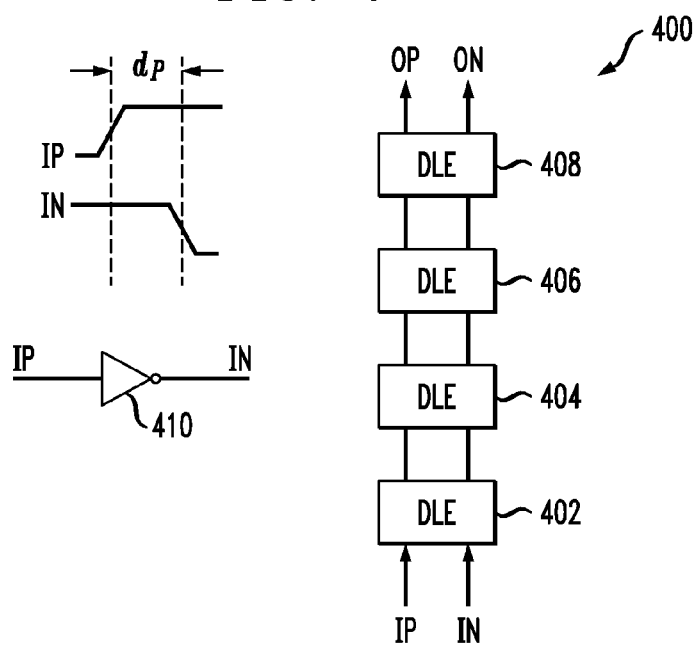
FIG. 4 is a schematic diagram depicting at least a portion of an exemplary differential delay chain which may be utilized in the delay circuit shown in FIG. 3, in accordance with an embodiment of the invention.

With reference now to FIG. 4, an exemplary differential delay chain 400 is shown which may be utilized in the delay circuit shown in FIG. 3, in accordance with an embodiment of the invention. The differential delay chain 400 includes a plurality of differential DLEs, 402, 404, 406 and 408, connected together in a series chain. Delay chain 400 is adapted to receive complementary input signals, IP and IN, and to generate complementary output signals, ON and OP. When using differential DLEs, the input signals IP and IN driving the delay chain are ideally complementary. A simple method of deriving complementary signals (e.g., IP and IN) from a single-ended input signal (e.g., IP) is to pass the input signal IP through a standard inverter 410. Signal IN generated at an output of the inverter 410 will lag signal IP presented to an input of the inverter by a prescribed delay, $d_P$, which will be substantially equal to a propagation delay of the inverter. This causes the delay line input to be only approximately complementary. A delay chain formed using differential DLEs of the type shown in FIG. 1 is generally able to "correct" the non-complementarity of the input signals after the first few stages of the delay line. However, this remains a source of duty cycle distortion.

Figure 5:
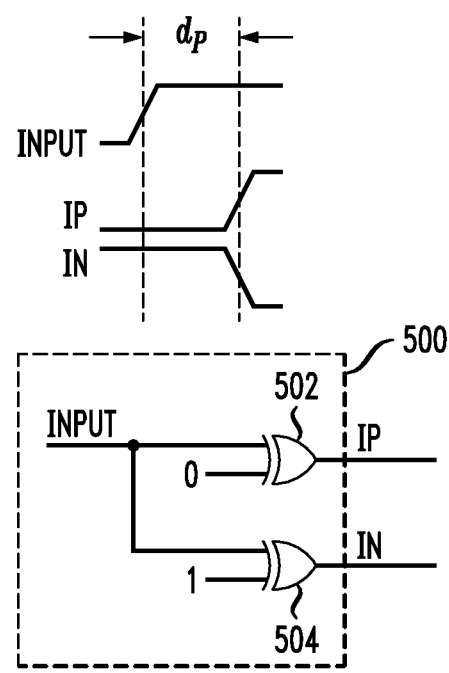
FIG. 5 is a schematic diagram depicting at least a portion of an exemplary signal generator circuit which can be employed for generating complimentary clock signals for driving the differential delay chain shown in FIG. 4, in accordance with an aspect of the invention.

FIG. 5 is a schematic diagram depicting at least a portion of an exemplary signal generator circuit 500, formed in accordance with an aspect of the invention. Signal generator circuit 500 is operative to generate true complementary output signals, IP and IN, which can be used as inputs to the differential delay line 400 shown in FIG. 4, from a singe-ended input signal, INPUT. Signals IP and IN are true complementary output signals relative to one another at least in the sense that a rising edge of signal IP is substantially aligned with a falling edge of signal IN (as shown in the figure), and a falling edge of signal IP is substantially aligned with a rising edge of signal IN. Signal generator circuit 500 preferably includes a first exclusive-OR functional logic gate 502 and a second exclusive-OR functional logic gate 504. First inputs of exclusive-OR gates 502 and 504 are adapted for receiving the single-ended input signal INPUT, a second input of exclusive-OR gate 502 is connected to a logic low level voltage source, which may be ground (e.g., zero volts), and a second input of exclusive-OR gate 504 is connected to a logic high level voltage source, which may be Vdd. Although exclusive-OR gates are employed in signal generator circuit 500, various alternative signal generation methodologies may be employed for generating a pair of true complementary signals, as will become apparent to those skilled in the art.

Using signal generator circuit 500, duty cycle distortion associated with a non-complementary (e.g., single-ended) delay line input signal, such as the type shown in FIG. 4, can be advantageously eliminated or at least significantly reduced. Another advantage to using this structure is that the polarity of the output signals IP and IN generated by circuit 500 can be inverted simply by changing the logic "0" input to exclusive-OR gate 502 to a logic "1" and, similarly, by changing the logic "1" input to exclusive-OR gate 504 to a logic "0," while maintaining the same delay through the circuit. This will cause the output of the delay circuit in which the signal generator circuit 500 may be used to be inverted from the input, which may be useful in certain applications.

At least a portion of the circuits and methodologies of the present invention may be implemented in one or more integrated circuits. In forming integrated circuits, die are typically fabricated in a repeated pattern on a surface of a semiconductor wafer. Each of the die includes a device described herein, and may include other structures or circuits. Individual die are cut or diced from the wafer, then packaged as integrated circuits. One skilled in the art would know how to dice wafers and package die to produce integrated circuits. Integrated circuits so manufactured are considered part of this invention.

An integrated circuit in accordance with the present invention can be employed in any application and/or electronic system which utilizes memory, embedded or otherwise. Suitable systems for implementing techniques of the invention may include, but are not limited to, personal computers, communication networks, electronic instruments (e.g., automated test equipment (ATE)), interface networks, etc. Systems incorporating such integrated circuits are considered part of this invention. Given the teachings of the invention provided herein, one of ordinary skill in the art will be able to contemplate other implementations and applications of the techniques of the invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A delay circuit, comprising:
    a plurality of delay elements connected together in a series configuration, each of the plurality of delay elements being connected to at least another of the plurality of delay elements, and each of the delay elements having a prescribed delay and an output associated therewith; and
    a controller connected to each of the respective outputs of the plurality of delay elements, the controller being configured such that signal paths between each of the respective outputs of the plurality of delay elements and an output of the controller have corresponding delays associated therewith that are substantially equal to one another, the controller comprising a plurality of tri-statable switching elements, each of the signal paths having a given one of the tri-statable switching elements associated therewith, each of the tri-statable switching elements having an input connected to a corresponding one of the outputs of the delay elements and an output, each of the respective outputs of the plurality of delay elements being connected to a corresponding one of the inputs of the tri-statable switching elements, wherein the respective outputs of each of the tri-statable switching elements are connected together at a single node, wherein each of the plurality of delay elements comprises a differential delay element and each of the respective outputs of the delay elements comprises first and second complementary outputs from each differential delay element, the plurality of delay elements forming a differential delay chain, and wherein each differential delay element comprises two complementary inputs.

2. The circuit of claim 1, wherein each of the tri-statable switching elements associated with the respective signal paths includes a control input adapted to receive a corresponding control signal, each of the tri-statable switching elements being operative to generate a first signal representative of a second signal applied to the tri-statable switching element in a first mode and being operative in a high-impedance state in a second mode as a function of the control signal.

3. The circuit of claim 1, wherein each of at least a subset of the tri-statable switching elements comprises a tri-statable inverter.

4. The circuit of claim 1, wherein the plurality of tri-statable switching elements comprise a plurality of tri-statable inverters, an input of each of the tri-statable inverters being connected to a corresponding one of the delay elements, respective outputs of each of the tri-statable inverters being connected together, and a control input of each of the tri-statable inverters being operative to receive a corresponding control signal, each of the tri-statable inverters being operative to generate a first signal representative of a second signal applied to the input of the tri-statable inverter in a first mode and being operative in a high-impedance state in a second mode as a function of the control signal.

5. The circuit of claim 4, wherein the controller further comprises at least one tri-statable buffer including an input connected to the respective outputs of the tri-statable inverters and operative to receive the first signal, an output for generating an output signal of the delay circuit, and a control input for receiving a select signal, the tri-statable buffer being operative to generate the output signal of the delay circuit which is representative of the first signal applied to the input of the tri-statable buffer in a first mode and being operative in a high-impedance state in a second mode as a function of the select signal.

6. The circuit of claim 1, further comprising a decoder connected to the controller, the decoder being operative to receive at least one control signal and to generate a plurality of select signals as a function thereof for selecting a given one of the signal paths and corresponding delay associated therewith.

7. The circuit of claim 1, wherein the respective inputs of the tri-statable switching elements are connected to corresponding first complementary outputs of the differential delay elements, and wherein the controller further comprises a second plurality of tri-statable switching elements, each of the second plurality of tri-statable switching elements having an input and an output, the inputs of the second plurality of tri-statable switching elements being connected to corresponding second complementary outputs of the differential delay elements and the outputs of the second plurality of tri-statable switching elements being connected together.

8. The circuit of claim 7, wherein at least a given one of the differential delay elements comprises:
a first inverter having a first drive strength associated therewith, an input of the first inverter being adapted to receive a first input signal applied thereto and being operative to generate a first output signal being delayed from the first input signal by a prescribed delay value;
a second inverter having the first drive strength associated therewith, an input of the second inverter being adapted to receive a second input signal applied thereto and being operative to generate a second output signal being delayed from the second input signal by the prescribed delay value;
a third inverter having a second drive strength associated therewith, the second drive strength being less than the first drive strength, an input of the third inverter being coupled to the output of the first inverter and an output of the third inverter being coupled to the output of the second inverter; and
a fourth inverter having the second drive strength associated therewith, an input of the fourth inverter being coupled to the output of the second inverter and an output of the fourth inverter being coupled to the output of the first inverter.

9. The circuit of claim 7, further comprising a signal generator circuit connected to a first one of the differential delay elements, the signal generator circuit being operative to receive a first signal and to generate second and third signals as a function of the first signal, the second and third signals being true complements with respect to one another.

10. The circuit of claim 9, wherein a rising edge of the second signal is substantially aligned with a falling edge of the third signal, and a falling edge of the second signal is substantially aligned with a rising edge of the third signal.

11. A delay circuit, comprising:
a plurality of delay elements connected together in a series configuration, each of the delay elements having a prescribed delay and an output associated therewith; and
a controller connected to each of the respective outputs of the plurality of delay elements, the controller being configured such that signal paths between each of the respective outputs of the plurality of delay elements and an output of the controller have corresponding delays associated therewith that are substantially equal to one another, the controller comprising a plurality of tri-statable switching elements, each of the signal paths having a given one of the tri-statable switching elements associated therewith, each of the tri-statable switching elements having an input connected to a corresponding one of the outputs of the delay elements and an output, wherein the outputs of the tri-statable switching elements are connected together;
wherein each of the plurality of delay elements comprises a differential delay element and each of the respective outputs of the delay elements comprises first and second complementary outputs, the plurality of delay elements forming a differential delay chain, and wherein the respective inputs of the tri-statable switching elements are connected to corresponding first complementary outputs of the differential delay elements, and wherein the controller further comprises a second plurality of tri-statable switching elements, each of the second plurality of tri-statable switching elements having an input and an output, the inputs of the second plurality of tri-statable switching elements being connected to corresponding second complementary outputs of the differential delay elements and the outputs of the second plurality of tri-statable switching elements being connected together;
the circuit further comprising a signal generator circuit connected to a first one of the differential delay elements, the signal generator circuit being operative to receive a first signal and to generate second and third signals as a function of the first signal, the second and third signals being true complements with respect to one another;

wherein the signal generator circuit comprises first and second exclusive-OR functional logic gates, first inputs of the first and second exclusive-OR functional logic gates being connected together and adapted for receiving the first input signal, a second input of the first exclusive-OR functional logic gate being connected to a logic low level voltage source, a second input of the second exclusive-OR functional logic gate being connected to a logic high level voltage source, and outputs of the first and second exclusive-OR functional logic gates being operative to generate the second and third signals, respectively.

12. The circuit of claim 1, wherein each of the plurality of delay elements has a same delay associated therewith.

13. The circuit of claim 1, wherein at least a first of the plurality of delay elements has a first delay associated therewith and at least a second of the plurality of delay elements has a second delay associated therewith, the first delay being different than the second delay.

14. A method of reducing duty cycle distortion in a delay circuit including a plurality of delay elements, each of the delay elements having an outputs associated therewith, and a controller connected to each of the respective outputs of the delay elements, the method comprising the steps of:

configuring the delay circuit such that delay signal paths between each of the respective outputs of the delay elements and an output of the controller have corresponding delays associated therewith that are substantially equal to one another;

applying a signal to be delayed by a prescribed delay amount to an input of the delay circuit; and selecting one of the delay signal paths between respective outputs of the plurality of delay elements and an output of the delay circuit corresponding to the prescribed delay amount, each of the delay signal paths having a tri-statable switching element associated therewith;

wherein each of the plurality of delay elements is connected to at least another of the plurality of delay elements;

wherein each of the respective outputs of the plurality of delay elements is connected to a corresponding one of the inputs of the tri-statable switching elements;

wherein the respective outputs of each of the tri-statable switching elements are connected together at a single node;

wherein each of the plurality of delay elements comprises a differential delay element and each of the respective outputs of the delay elements comprises first and second complementary outputs from each differential delay element, the plurality of delay elements forming a differential delay chain; and wherein each differential delay element comprises two complementary inputs.

15. The method of claim 14, wherein the step of selecting one of the plurality of delay signal paths comprises:

activating a given one of the tri-statable switching elements associated with the delay signal path corresponding to the prescribed delay amount; and placing remaining tri-statable switching elements not associated with the delay signal path corresponding to the prescribed delay amount in a high impedance state.

16. An integrated circuit including at least one delay circuit, the at least one delay circuit comprising:

a plurality of delay elements connected together in a series configuration, each of the plurality of delay elements being connected to at least another of the plurality of delay elements, and each of the delay elements having a prescribed delay and an output associated therewith; and a controller connected to each of the respective outputs of the plurality of delay elements, the controller being configured such that signal paths between each of the respective outputs of the plurality of delay elements and an output of the controller have corresponding delays associated therewith that are substantially equal to one another, each of the signal paths having a tri-statable switching element associated therewith, each of the tri-statable switching elements having an input connected to a corresponding one of the outputs of the delay elements and an output, each of the respective outputs of the plurality of delay elements being connected to a corresponding one of the inputs of the tri-statable switching elements, wherein the respective outputs of each of the tri-statable switching elements are connected together at a single node, wherein each of the plurality of delay elements comprises a differential delay element and each of the respective outputs of the delay elements comprises first and second complementary outputs from each differential delay element, the plurality of delay elements forming a differential delay chain, and wherein each differential delay element comprises two complementary inputs.

17. The integrated circuit of claim 16, wherein each of the tri-statable switching elements associated with the respective signal paths includes a first node connected to a corresponding one of the delay elements, a second node of each of the tri-statable switching elements being connected together, a control input of each of the tri-statable switching elements being adapted to receive a corresponding control signal, each of the tri-statable switching elements being operative to generate a first signal representative of a second signal applied to the tri-statable switching element in a first mode and being operative in a high-impedance state in a second mode as a function of the control signal.

18. The integrated circuit of claim 16, wherein each of at least a subset of the tri-statable switching elements comprises a tri-statable inverter.

19. The integrated circuit of claim 16, wherein the controller comprises a plurality of tri-statable inverters, an input of each of the tri-statable inverters being connected to a corresponding one of the delay elements, respective outputs of each of the tri-statable inverters being connected together, and a control input of each of the tri-statable inverters being operative to receive a corresponding control signal, each of the tri-statable inverters being operative to generate a first signal representative of a second signal applied to the input of the tri-statable inverter in a first mode and being operative in a high-impedance state in a second mode as a function of the control signal.

20. The integrated circuit of claim 19, wherein the controller further comprises at least one tri-statable buffer including an input connected to the respective outputs of the tri-statable inverters and operative to receive the first signal, an output for generating an output signal of the delay circuit, and a control input for receiving a select signal, the tri-statable buffer being operative to generate the output signal of the delay circuit which is representative of the first signal applied to the input of the tri-statable buffer in a first mode and being operative in a high-impedance state in a second mode as a function of the select signal.

21. The integrated circuit of claim 16, wherein the at least one delay circuit further comprises a decoder connected to the controller, the decoder being operative to receive at least one control signal and to generate a plurality of select signals as a function thereof for selecting one of signal paths and corresponding delay associated therewith.

22. The integrated circuit of claim 16, wherein the at least one delay circuit further comprises a signal generator circuit connected to a first one of the differential delay elements, the signal generator circuit being operative to receive a first signal and to generate second and third signals as a function of the first signal, the second and third signals being true complements with respect to one another.

23. The circuit of claim 1, wherein each of the plurality of delay elements is connected to at least another of the plurality of delay elements with no other delay elements therebetween.

* * * * *